United States Patent
Horita (10) Patent No.: US 7,448,006 B2
(45) Date of Patent: Nov. 4, 2008

(54) LOGIC-SYNTHESIS METHOD AND LOGIC SYNTHESIZER

(75) Inventor: Keisuke Horita, Chigasaki (JP)

(73) Assignee: Fujitsu Limited, Kawasaki (JP)

( * ) Notice: Subject to any disclaimer, the term of this patent is extended or adjusted under 35 U.S.C. 154(b) by 160 days.

(21) Appl. No.: 11/334,694

(22) Filed: Jan. 19, 2006

(65) Prior Publication Data

US 2007/0016885 A1     Jan. 18, 2007

(30) Foreign Application Priority Data

Jul. 15, 2005     (JP)     ............................ 2005-206478

(51) Int. Cl.
  *G06F 17/50*     (2006.01)
  *G06F 9/45*     (2006.01)
(52) U.S. Cl. .................................. 716/6; 716/5; 716/18
(58) Field of Classification Search ................. 716/1–6, 716/17, 18; 703/13, 14
See application file for complete search history.

(56) References Cited

U.S. PATENT DOCUMENTS

| 5,864,487 | A  | * | 1/1999 | Merryman et al. | ............. | 716/6 |
| 6,910,202 | B2 | * | 6/2005 | Minami et al. | ................. | 716/18 |
| 7,007,263 | B2 | * | 2/2006 | Yang et al. | ...................... | 716/6 |

FOREIGN PATENT DOCUMENTS

| JP | 2002-312411 | 10/2002 |
| JP | 2004-62694 | 2/2004 |

* cited by examiner

*Primary Examiner*—Jack Chiang
*Assistant Examiner*—Nghia M Doan
(74) *Attorney, Agent, or Firm*—Staas & Halsey LLP (57) ABSTRACT

The present invention provides a logic-synthesis method and a logic synthesizer that can estimate the performance of an LSI circuit during the RTL-design phase. The logic-synthesis method includes the steps of generating a library having a buffer-tree-characteristic description, determining the position where the fanout value is high by analyzing a logic-design description, specifying the configuration of a buffer tree including the high fanout position, and performing logic synthesis according to the logic-design description.

15 Claims, 10 Drawing Sheets

LOGIC-SYNTHESIS METHOD AND LOGIC SYNTHESIZER

CROSS-REFERENCE TO RELATED APPLICATIONS

This application is based upon and claims the benefit of priority from the prior Japanese Patent Application No. 2005-206478, filed on Jul. 15, 2005 the entire contents of which are incorporated herein by reference.

BACKGROUND OF THE INVENTION

1. Field of the Invention

The present invention relates to a logic-synthesis method and a logic synthesizer that allows designing a large scale integration (LSI) with efficiency, and particularly relates to a logic-synthesis method and a logic synthesizer that can achieve the target performance of an LSI at an early stage by increasing the quality of a library used for performing logic synthesis.

2. Description of the Related Art

The step of developing a system LSI is usually divided into two steps including the step of performing logic design, that is, register transfer level (RTL) design and the step of performing layout design.

In the past, timing estimation performed by using a wire-load model during the RTL-design phase allows reducing timing violation without making significant correction during the layout-design step, even though the system-LSI development system is divided into the above-described two steps. That is to say, the system-LSI development step could be divided into the RTL-design step and the layout-design step with success. Here, the term "wire-load model" denotes a timing model adapted to estimate a signal delay on the basis of a load connected to a circuit net and the drive ability of a logic circuit.

In recent years, however, the signal delay has become increasingly susceptible to a wiring delay instead of a logic-gate delay that can be estimated by using the wire-load model, as the wiring of semiconductor devices becomes increasing smaller. Since the wiring delay cannot be estimated during the RTL-design phase, unexpected timing violation often occurs. Particularly, when fanout becomes high, that is, when high-fanout connection is generated due to a certain RTL description, the wiring delay that cannot be estimated during the RTL-design phase becomes so significant that serious timing violation occurs. Subsequently, significant correction has to be made during the layout-design step, so as to resolve the serious timing violation.

Although the layout design is corrected, it is not assured that the timing violation will never occur. Therefore, it has been proposed to take measures against the timing violation during the RTL-description phase.

For example, according to a logic-synthesis method disclosed in Japanese Unexamined Patent Application Publication No. 2002-312411, first, RTL analysis is performed, and the position of a description showing high fanout is detected. Next, when the processing proceeds to the step of designing layout, a clock tree whose fanout can be adjusted by adjusting wiring or the like is inserted in the high-fanout description of the RTL description.

Subsequently, it becomes possible to improve timing without making a significant layout change when the layout is designed after the logic synthesis is performed. Further, it becomes possible to design the most suitable layout and wiring, and achieve appropriate load balancing.

Further, the LSI performance, that is, the relationship between consumption power and speeding up timing should be calculated during the RTL-design phase. However, since the logic-synthesis method disclosed in Japanese Unexamined Patent Application Publication No. 2002-312411 does not allow performing appropriate layout and wiring, load balancing is not achieved. Therefore, when the LSI performance is determined by a circuit path including a high-fanout position, the processing proceeds to the layout-design step irrespective of the LSI performance. Subsequently, the deterioration of timing, increased consumption power, and so forth that are caused by an improvement in consumption power or the like that is made during the layout-design step cannot be estimated.

SUMMARY OF THE INVENTION

Accordingly, the present invention provides a logic-synthesis method and a logic synthesizer that can estimate the performance of an LSI at an early stage, that is, during the RTL-design phase, so as to reduce the timing deterioration, increased consumption power, and so forth that are caused by an improvement that is made during the step of designing layout.

Therefore, a logic-synthesis method according to an embodiment of the present invention includes the step of generating a library having a buffer-tree-characteristic description, determining the position where the fanout value becomes greater than a predetermined value by analyzing a logic-design description, specifying the configuration of the buffer tree showing the position where the fanout value becomes greater than the predetermined value, and performing logic synthesis by using the library and the logic-design description.

Further, a logic synthesizer according to another embodiment of the present invention includes a unit configured to generate a library having a buffer-tree-characteristic description, a unit configured to determine the position where the fanout value is high by analyzing a logic-design description, a unit configured to specify the configuration of the buffer tree including the high-fanout position, and a unit configured to perform logic synthesis by using the library and the logic-design description.

DESCRIPTION OF THE PREFERRED EMBODIMENTS

Hereinafter, first and second embodiments of the present invention will be described with reference to the attached drawings.

[First Embodiment]

A logic-synthesis method according to the first embodiment will be described with reference to FIGS. 1, 2, 3, 4, 5, 6, 7, 8, 9A, and 9B.

Figure 1:
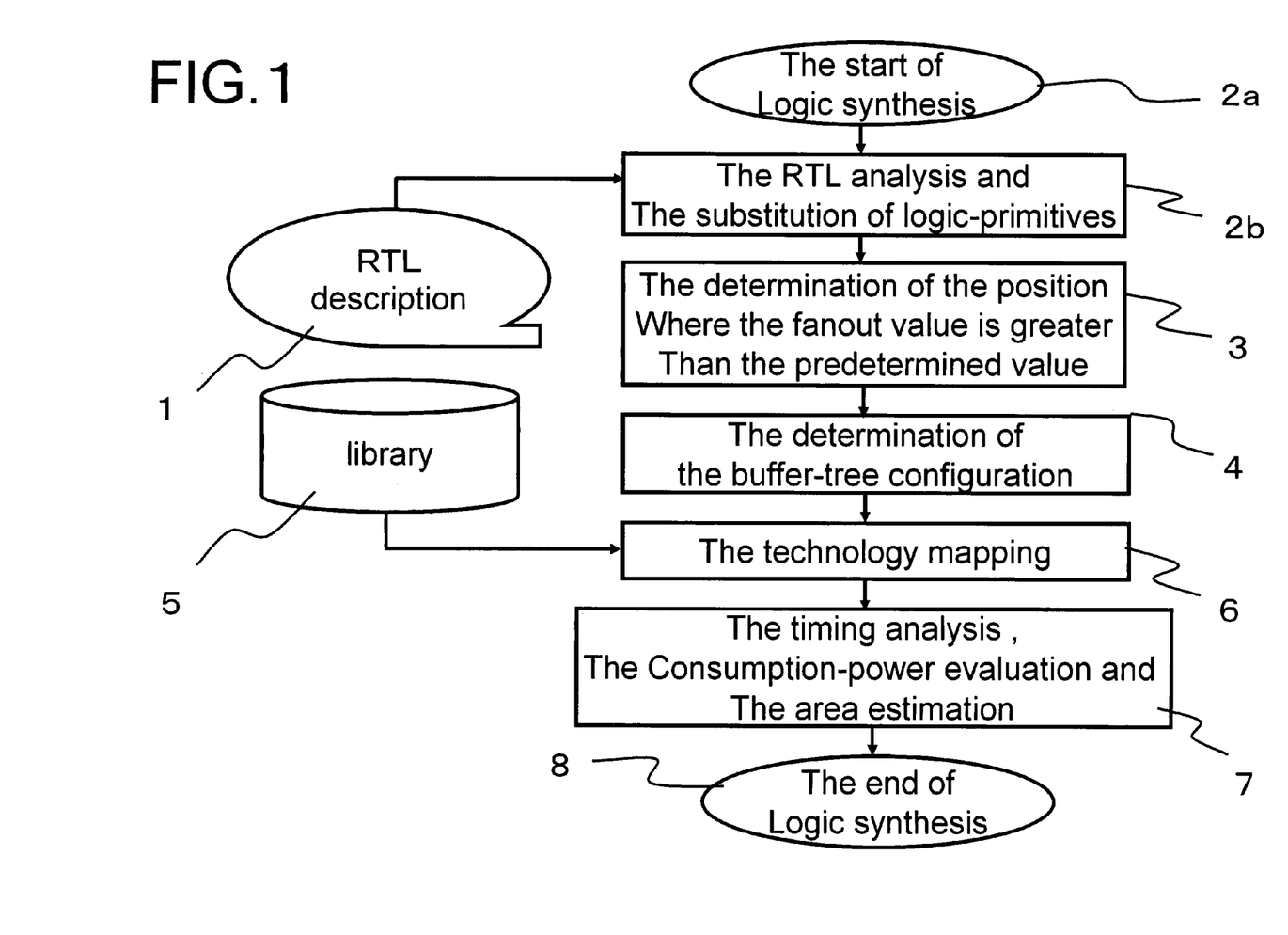
FIG. 1 is a flowchart illustrating a logic-synthesis method according to a first embodiment of the present invention.

FIG. 1 is a flowchart illustrating the above-described logic-synthesis method. In this drawing, reference numeral 1 denotes a register-transfer-level (RTL) description, reference numeral 2a denotes the step of starting of logic synthesis, reference numeral 2b denotes the step of performing RTL analysis and substitution of logic primitives, reference numeral 3 denotes the step of determining the position where the fanout value is greater than a predetermined value, reference numeral 4 denotes the step of specifying the configuration of a buffer tree, reference numeral 5 denotes a library, reference numeral 6 denotes the step of performing technology mapping, reference numeral 7 denotes the step of performing the timing analysis, the consumption-power evaluation, and the area estimation, and reference numeral 8 denotes the step of terminating the logic synthesis.

The RTL description 1 is a file including the description of a circuit configuration. Therefore, the RTL description 1 is usually written in a language adapted to describe logic, such as VHSIC Hardware Description Language (VHDL), Verilog Hardware Description Language (Verilog-HDL), and so forth.

The library 5 is a file including a plurality of data items relating to technology cells used for performing LSI mounting.

At Step 2a, the logic synthesis is started. Here, the term "logic synthesis" denotes substitution of the logic primitives for an entire logic circuit on the basis of the specification description of the logic circuit, that is, the RTL description 1 and generating a net list including technology cells used for performing LSI mounting, where performing the LSI mounting denotes performing physical layout processing.

The RTL analysis and the substitution of logic-primitives performed at Step 2b denote substitution of the logic primitives for the entire logic circuit on the basis of the RTL description 1.

At step 3, the position where the fanout value is greater than the predetermined value is determined. More specifically, in a logic-primitive circuit obtained by performing the RTL analysis and the substitution of the logic primitives at Step 2b, the position where a single drive element drives at least two elements is determined, and the position where the number of the driven elements becomes greater than a predetermined number is determined. That is say, the position where the fanout value becomes greater than the predetermined value is determined, at step 3.

At step 4, the buffer-tree configuration is specified. More specifically, the configuration of a buffer tree that increases the fanout value is specified at the position where the fanout value becomes greater than the predetermined value.

At step 6, the technology mapping is performed. More specifically, substitution of the technology cells used for the LSI mounting for the logic-primitive circuit is performed by using the library 5 and optimization is performed so that a real logic circuit is synthesized.

At step 7, the timing analysis, the consumption-power evaluation, and the area estimation are performed. More specifically, simulation is performed by using a calculator based on the logic circuit synthesized in the above-described manner. Subsequently, timing between the logic elements is analyzed, the consumption power is evaluated, and the area of each of the logic elements is estimated.

At step 8, the logic synthesis is terminated.

Figure 2:
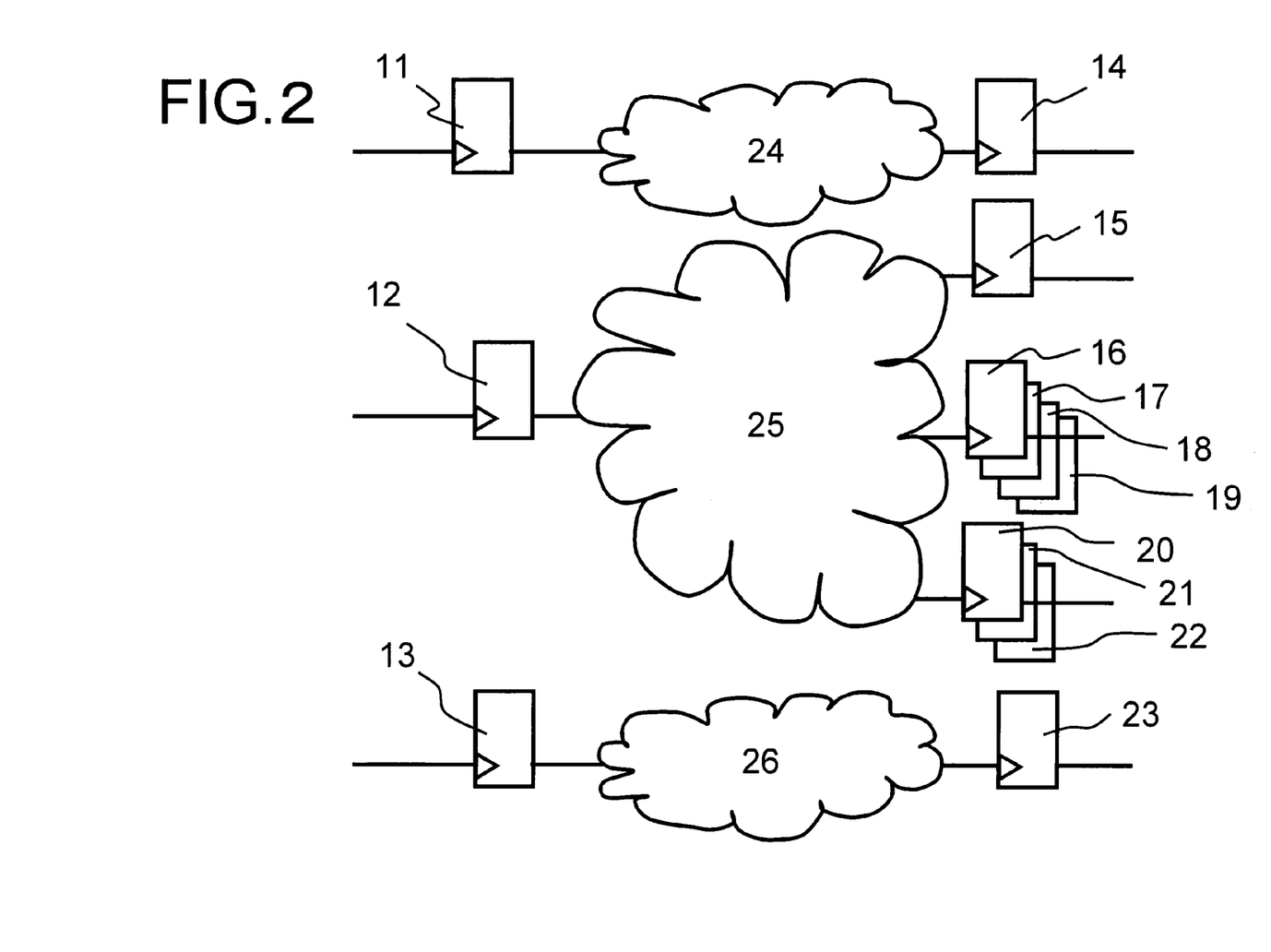
FIG. 2 shows the configuration of a logic-primitive circuit obtained by analyzing an RTL description and substituting logic primitives for a circuit configuration at the step of performing RTL analysis and substitution of logic primitives.

FIG. 2 shows the logic-primitive circuit obtained by performing the RTL analysis and the substitution of the logic primitives, at step 2b. Here, the logic primitives denote logic elements that are not physically laid out, where the logic elements include an AND gate, an OR gate, a register, and so forth.

Further, FIG. 2 shows registers 11, 12, 13, 14, 15, 16, 17, 18, 19, 20, 21, 22, and 23 and combination circuits 24, 25, and 26.

Further, the logic-primitive circuit of the first embodiment shown in FIG. 2 includes the following description, for example. Namely, the register 11 transfers data to the register 14 via the combination circuit 24. The resistor 12 transfers data to each of the registers 15, 16, 17, 18, 19, 20, 21, and 22 via the combination circuit 25. The register 13 transfers data to the register 23 via the combination circuit 26. Here, the combination circuit usually denotes a circuit including the combination of logic elements, where the input value and output value thereof are determined.

Therefore, at step 2b, the RTL description shown in FIG. 1 is analyzed, registers, combination circuits, and so forth are specified, and substitution of the logic primitives representing the circuit configuration shown in FIG. 2 for the circuit-configuration description is performed. As a result, the logic-primitive circuit shown in FIG. 2 is obtained.

Figure 3:
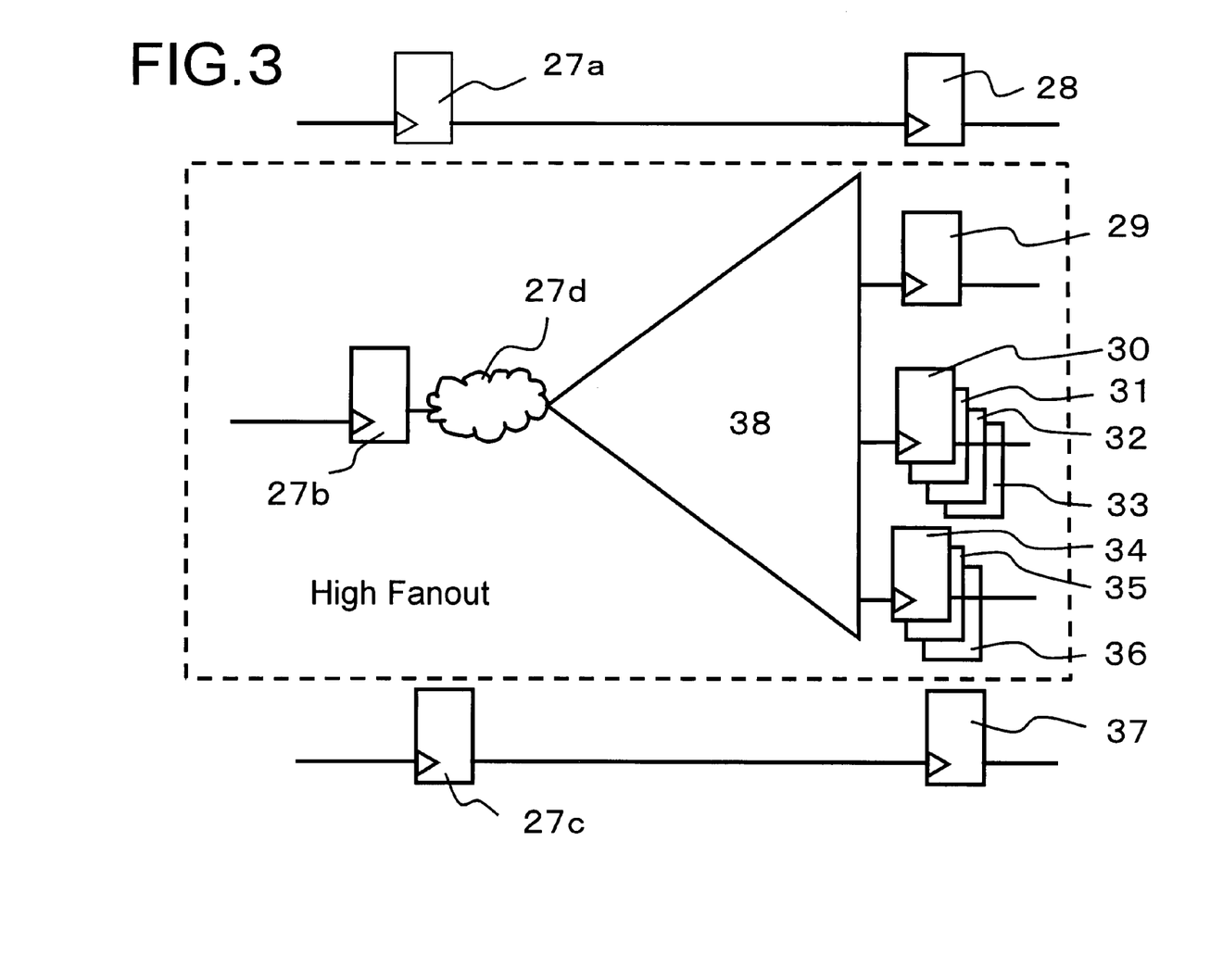
FIG. 3 illustrates the step of determining the position where the fanout value is greater than a predetermined value.

FIG. 3 illustrates processing procedures performed for determining the position where the fanout value becomes greater than the predetermined value. More specifically, FIG. 3 illustrates when the above-described determination is finished. In this drawing, each of reference numerals 27a, 27b, 27c, 28, 29, 30, 31, 32, 33, 34, 35, 36, and 37 denotes a register, reference numeral 27d denotes a combination circuit, and reference numeral 38 denotes the connection between registers, where the connection makes the fanout value greater than the predetermined value. The above-described connection is referred to as high fanout connection. An output end of the register 27a is connected to an input end of the register 28. An output end of the register 27b is connected to an input end of each of the registers 15, 16, 17, 18, 19, 20, 21, and 22 via the combination circuit 27d, so that the connection therebetween can be referred to as the high fanout connection. An output end of the register 27c is connected to an input end of the register 37.

The determination of the position where the value of the fanout value becomes greater than the predetermined value is performed in the following manner, for example. First, the logic-primitive circuit shown in FIG. 2 substituted on the basis of the RTL description 1 is analyzed and the connection relationship between the registers included in an LSI circuit and that between the combination circuit provided between the registers and the registers. Next, the position where an output end of a single register, or the combination circuit is connected to an input end of each of the plurality of registers or the like is detected. Next, the position where the number of input ends connected to the output end is greater than a predetermined number, that is, the position where the fanout value is greater than sixteen is detected. The detected position is determined to be the position where the fanout value is greater than the predetermined number (the position where the high fan-out connection is generated).

Figure 4:
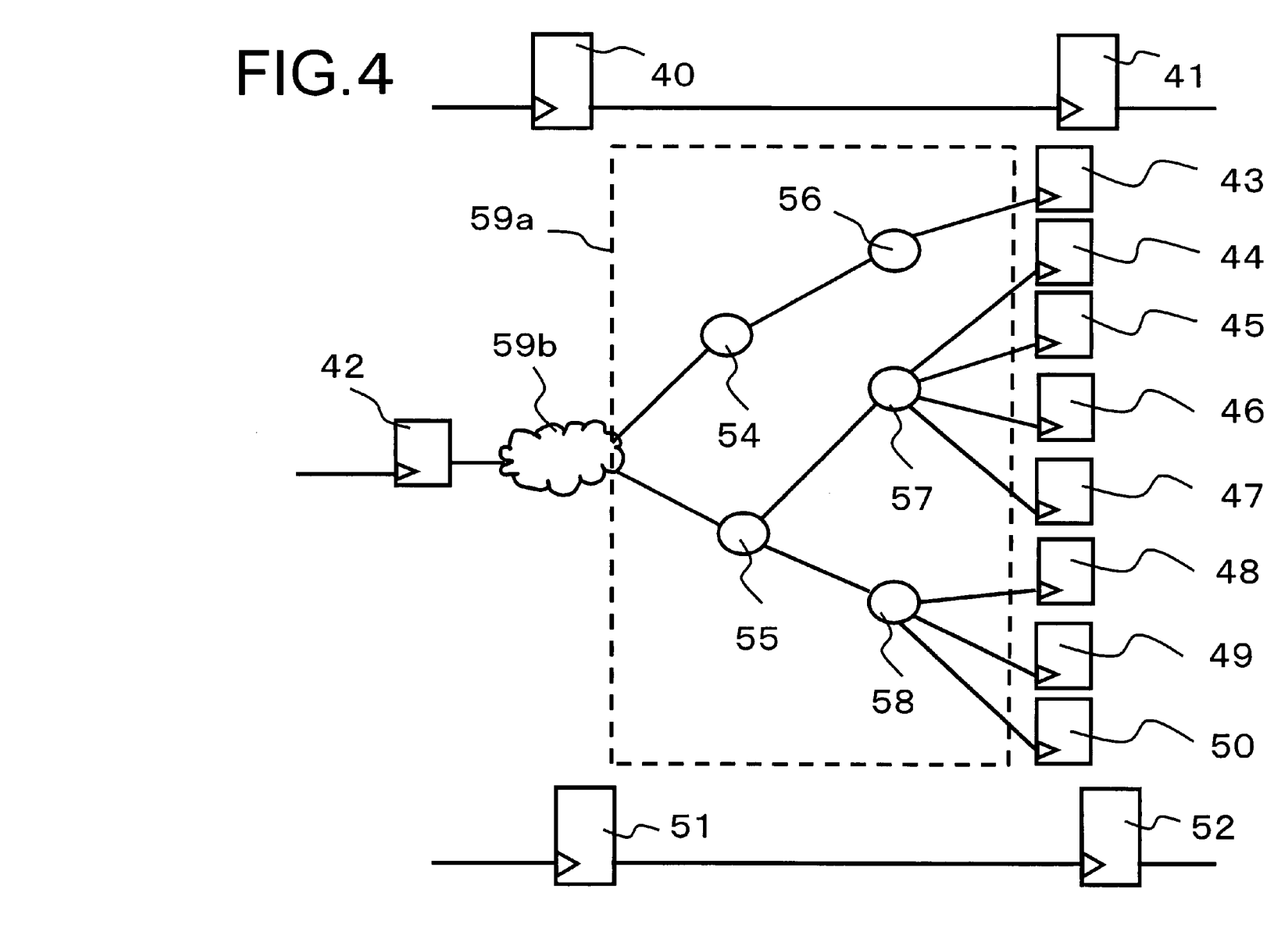
FIG. 4 illustrates the step of specifying the configuration of a buffer tree.

FIG. 4 shows processing procedures performed for specifying the buffer-tree configuration and an image of the buffer-tree configuration. As shown in this drawing, registers 40, 41, 42, 43, 44, 45, 46, 47, 48, 49, 50, 51, and 52, buffers 54, 55, 56, 57, and 58, a buffer 58, a buffer tree 59a, and a combination circuit 59b are provided.

Here, the term "buffer tree" denotes a treelike structure including buffers that are branched out, so as to reduce a signal delay and wave-form distortion caused by a signal transmitted from an output end having many output destinations. The buffer tree 59a exists in the library 5 shown in FIG. 1, as a characteristic description, and does not physically exist when logic synthesis is performed. Therefore, the buffer tree 59a shown in FIG. 4 is provided, as an image.

The output end of the register 40 is connected to the input end of the register 41. The output end of the register 42 is connected to the input end of each of the registers 43, 44, 45, 46, 47, 48, 49, and 50 via the combination circuit 59b and the buffer tree 59a, so that the high fanout connection is generated. The output end of the register 51 is connected to the input end of the register 52. According to the image of the buffer tree 59a, the buffers 54 and 55 are connected to the combination circuit 59b, the buffer 56 is driven by the buffer 54 and drives the register 43, the buffer 57 is driven by the buffer 55 and drives the registers 44, 45, 46, and 47, and the buffer 58 is driven by the buffer 55 and drives the registers 48, 49, and 50.

Therefore, processing procedures performed for determining the buffer-tree configuration indicate assigning an appropriate buffer tree, that is, the buffer tree 59a to the "position where the fanout value becomes greater than the predetermined value" determined by performing the processing procedures adapted to determine the position where the fanout value becomes greater than the predetermined value. The buffer tree 59a is selected by analyzing the logic-primitive circuit.

Figure 5:
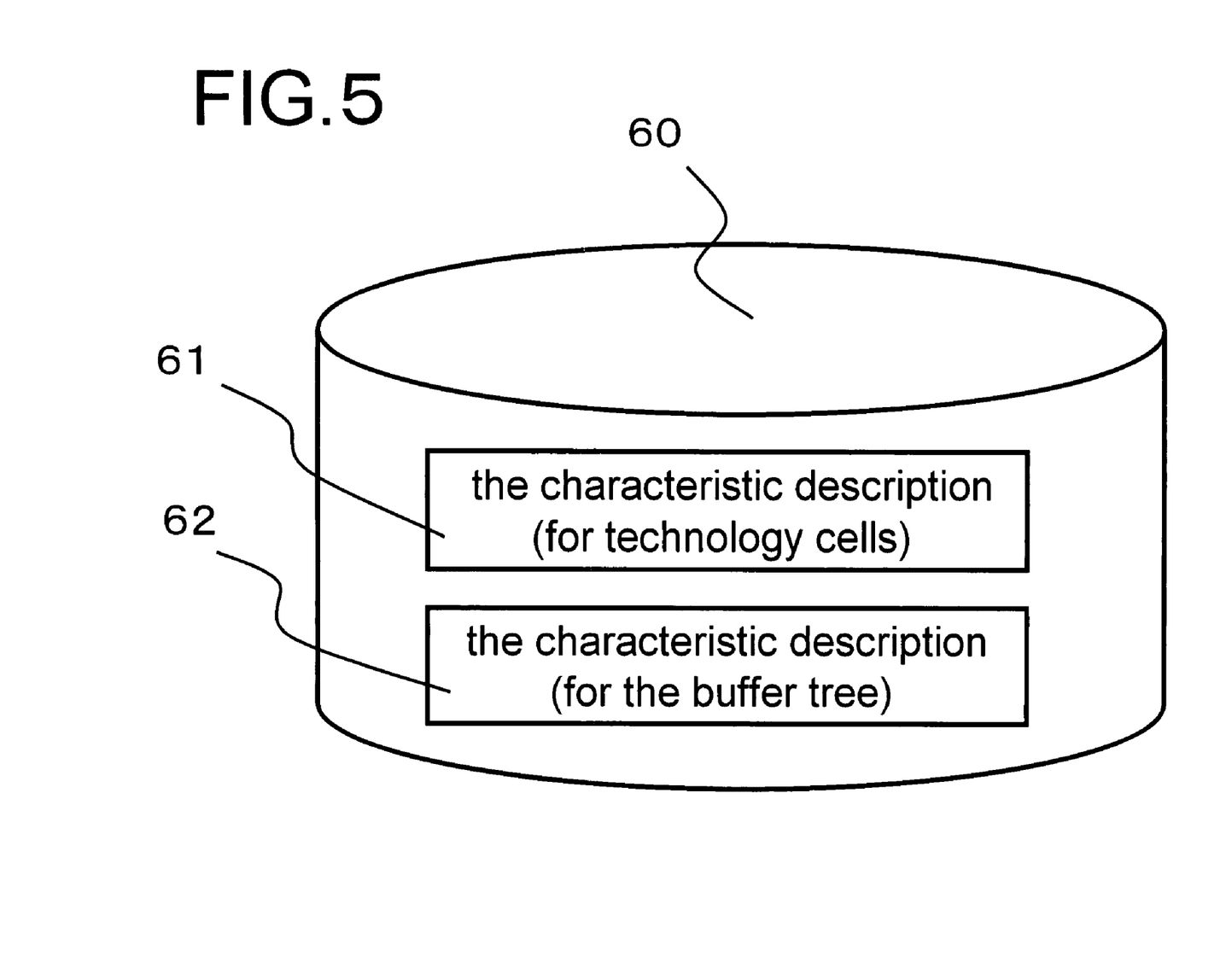
FIG. 5 illustrates a library.

FIG. 5 illustrates a library 60, a characteristic description 61 provided for describing the function characteristics of technology cells used for LSI mounting (physical layout), and a characteristic description 62 provided for describing the characteristics of the buffer tree 59a shown in FIG. 4. Here, the library 60 denotes a file collectively storing a plurality of data items. Further, the term "register" denotes a flip-flop circuit, a flip-flop circuit with a set terminal, a flip-flop circuit with a set-and-reset terminal, and so forth.

The library 60 includes data representing the characteristic description 61 describing the characteristics of various types of technology cells, data representing the physical layout of various types of registers, data representing the description of characteristics of other logic elements, data representing the physical layout of each of the logic elements, data representing the buffer-tree characteristic description 62, data representing the physical layout of the buffer tree, and other data items. Here, the above-described other logic elements include a buffer circuit, a NAND circuit with two input ends, a NOR circuit with two input ends, and so forth.

Figure 6:
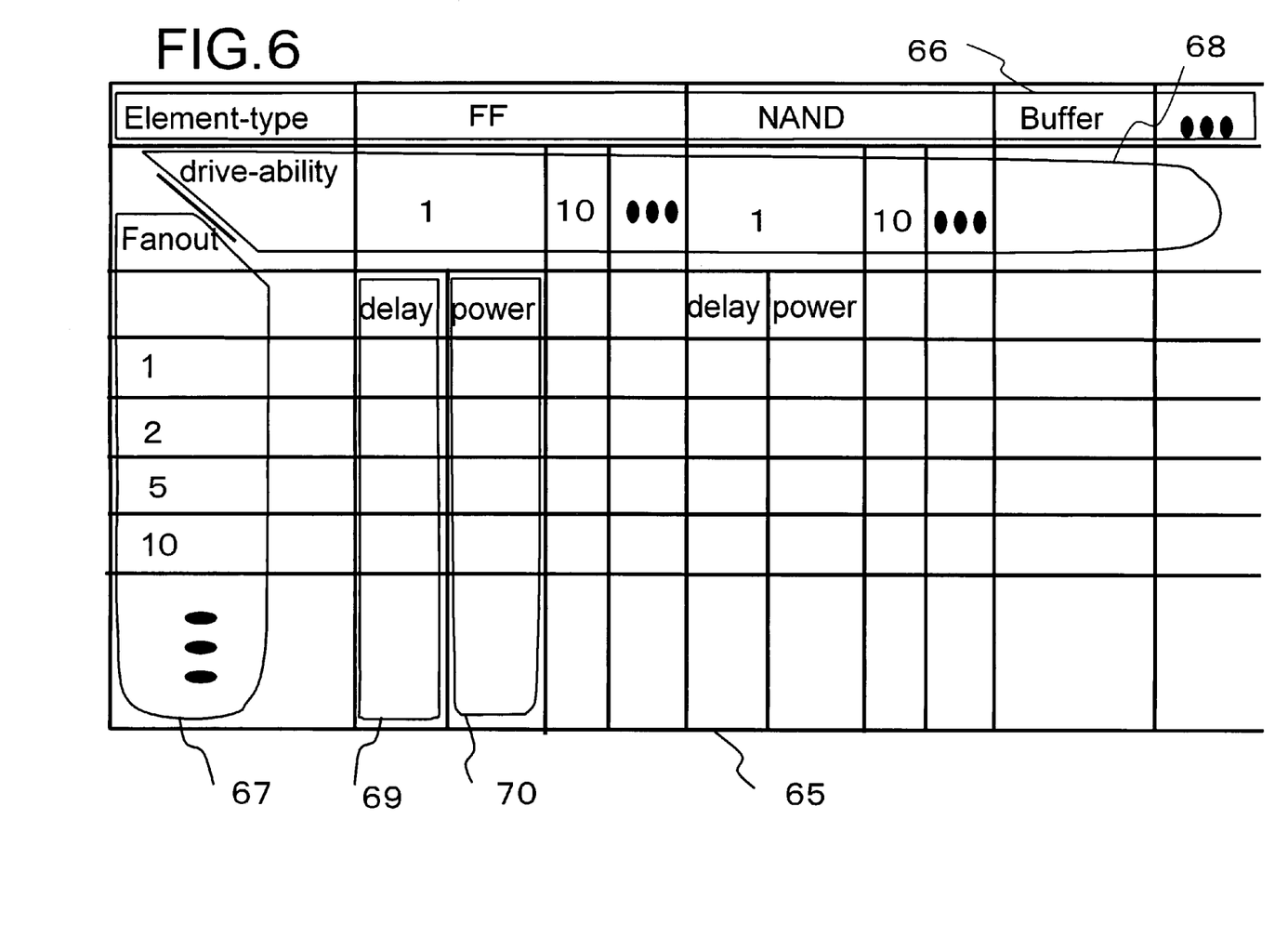
FIG. 6 illustrates the characteristic description of each of various technology cells.

FIG. 6 illustrates the description of characteristics of the various types of technology cells. A technology-cell-characteristic-description table 65 shown in FIG. 6 includes an element-type column 66, a fanout column 67, a drive-ability column 68, a signal-delay column 69, a power column 70, and so forth.

In the technology-cell-characteristic-description table 65, the element-type column 66 shows, for example, a flip-flop circuit, a flip-flop circuit with a set terminal, a flip-flop circuit with a set-and-reset terminal, and so forth. The fanout column 67 shows the fanout value of output ends of the technology cells. The drive-ability column 68 shows the drive ability of the output ends of the technology cells. The signal-delay column 69 shows the delay amount of a signal transmitted from the output end of each of the technology cells, where the signal delay corresponds to the drive ability and the fanout value. The power column 70 shows the consumption power of the technology cells, where the consumption power corresponds to the drive ability and the fanout value.

Thus, according to the technology-cell-characteristic-description table 65, the technology-cell-characteristic description includes the signal-delay amount, consumption power, and other information corresponding to the drive ability and the fanout value.

Figure 7:
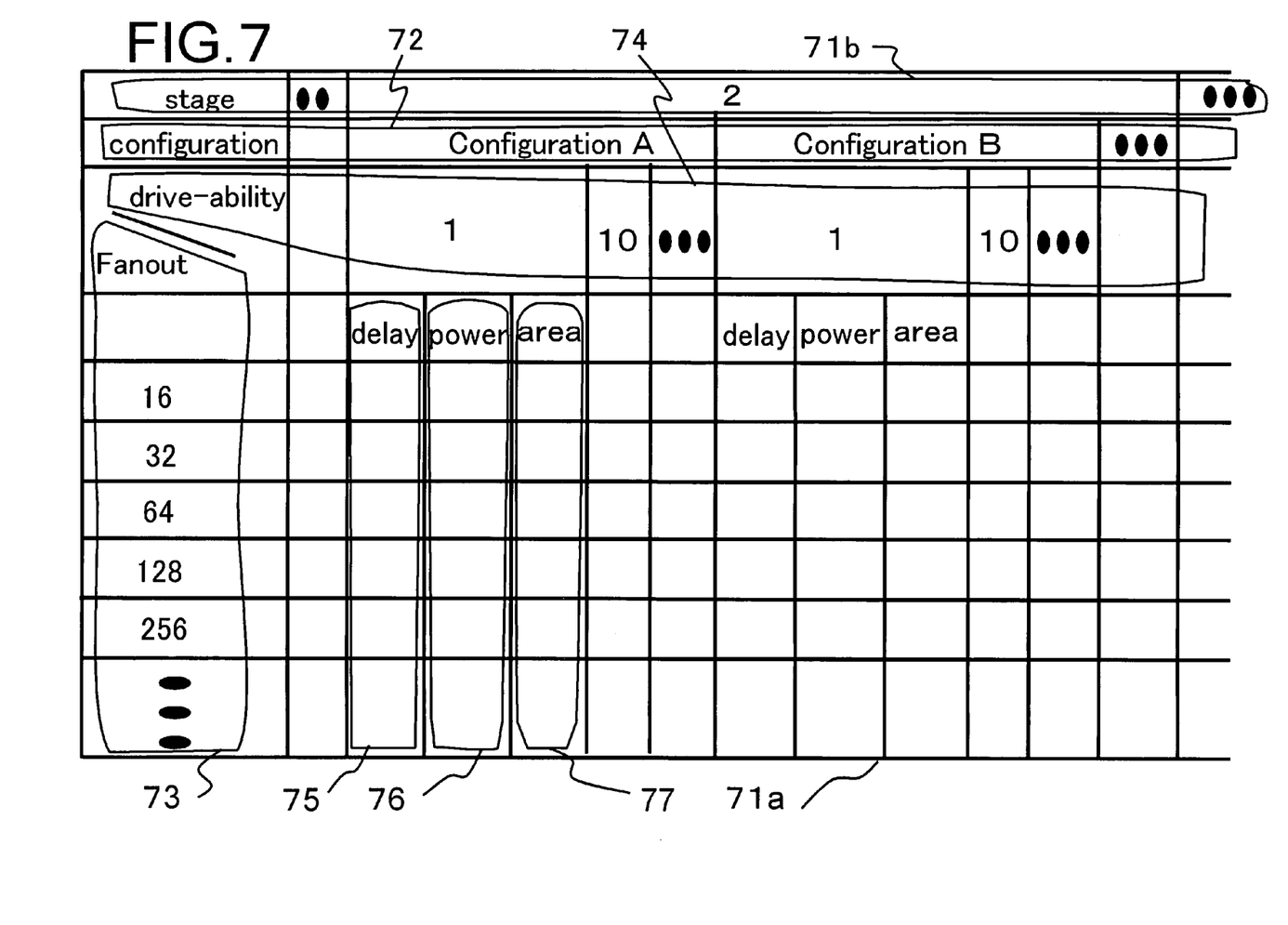
FIG. 7 illustrates the characteristic description of each of various buffer trees.

FIG. 7 illustrates the description of characteristics of various types of buffer trees. As shown in FIG. 7, a buffer-tree-characteristic-description table 71a includes a field 71b showing the number of buffer-tree stages, a field 72 showing the buffer-tree configuration, a column 73 showing the fanout value, a drive-ability column 74, a signal-delay column 75, a power column 76, a column 77, and so forth.

The column 71b showing the buffer-tree-stage number is provided, so as to show how many stages of buffers are included in the buffer tree. The buffer-tree-configuration field 72 is provided for showing classified buffer-tree types according to the number of buffers on each of the buffer-tree stages. The fanout column 73 shows the number of technology cells that output signals and that are driven via the buffer tree, as the fanout value of the buffer tree. The drive-ability field 74 shows the drive ability of the buffers forming the buffer tree. The signal-delay column 75 shows the delay amount of a signal transmitted from the output end of each of the technology cells, where the delay amount corresponds to the drive ability and the fanout value. The power column 76 shows the consumption power of the buffer tree, where the consumption power corresponds to the drive ability and the fanout value. The area column 77 is provided to show the estimation of an area occupied by pattern layout of the buffer tree.

Thus, according to the buffer-tree-characteristic-description table 71a, the buffer-tree characteristics include information about the signal-delay amount, the consumption power, and the area, and other information.

Further, the above-described buffer-tree characteristics (information about the signal-delay amount, the consumption power, and the area, and other information) can be obtained in advance by performing circuit simulation and/or layout simulation in consideration of physical layout performed based on track records. Namely, the buffer-tree characteristics can be obtained in advance on the basis of the number of buffer-tree stages, the buffer-tree-configuration type, the fanout value of the buffer tree, and the drive ability of buffers forming the buffer tree.

Figure 8:
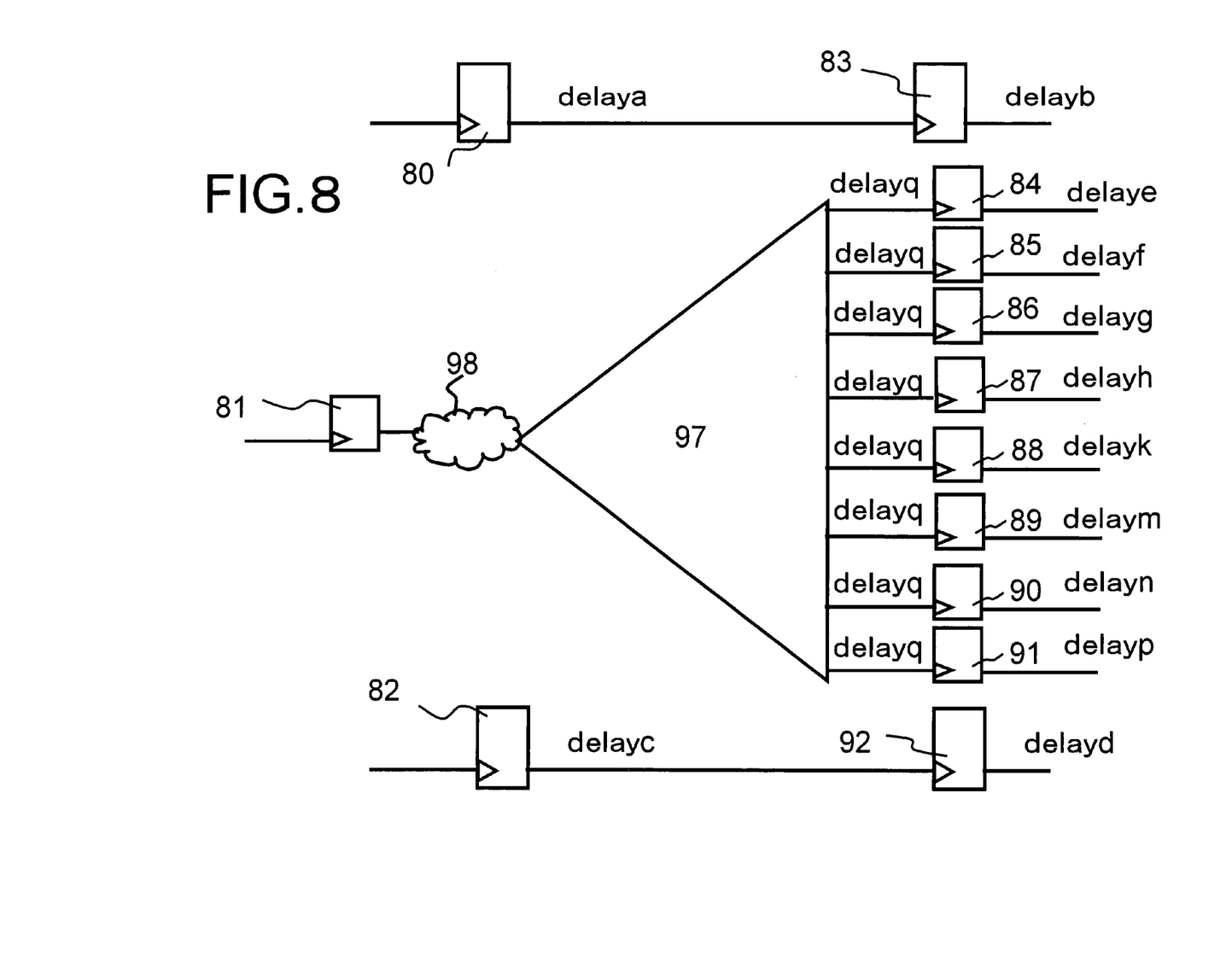
FIG. 8 illustrates the step of performing technology mapping and how the buffer tree of the first embodiment should be handled during the technology-mapping step.

FIG. 8 illustrates the step of performing technology mapping and how the buffer tree of the first embodiment should be handled during the technology-mapping step is performed.

More specifically, FIG. 8 shows a net list including the technology cell, where the net list is generated by performing the technology mapping. In this drawing, registers 80, 81, 82, 83, 84, 85, 86, 87, 88, 89, 90, 91, and 92, a buffer tree 97, and a combination circuit 98 are shown.

The output end of the register 80 is connected to the input end of the register 83. The buffer tree 97 transmits a signal transmitted from the combination circuit 98 to each of the registers 84, 85, 86, 87, 88, 89, 90, and 91. The output end of the register 82 is connected to the input end of the register 92.

Further, the register 80 outputs the signal transmitted thereto with a gate delay a. The register 83 outputs the signal transmitted thereto with a gate delay b. The register 82 outputs the signal transmitted thereto with a gate delay c. The register 92 outputs the signal transmitted thereto with a gate delay d. The registers 84, 85, 86, 87, 88, 89, 90, and 91 output the signals transmitted thereto with gate delays e, f, g, h, k, m, n, and p, respectively. The register 81 outputs the signal transmitted thereto with a delay q from each of eight output ends via the combination circuit 98 and the buffer tree 97.

Thus, the technology-mapping step includes determining the buffer-tree configuration for a logic-primitive circuit, assigning technology cells including physical layout, a characteristic description, and so forth to components of the logic-primitive circuit by using a library, so that a net list is obtained.

Subsequently, the technology cells are assigned to the registers, buffer tree, and so forth in the above-described manner so that the characteristic descriptions including information about the delay of an output signal, the physical layout, and so forth are assigned to the registers, buffer tree, and so forth.

Figure 9A:
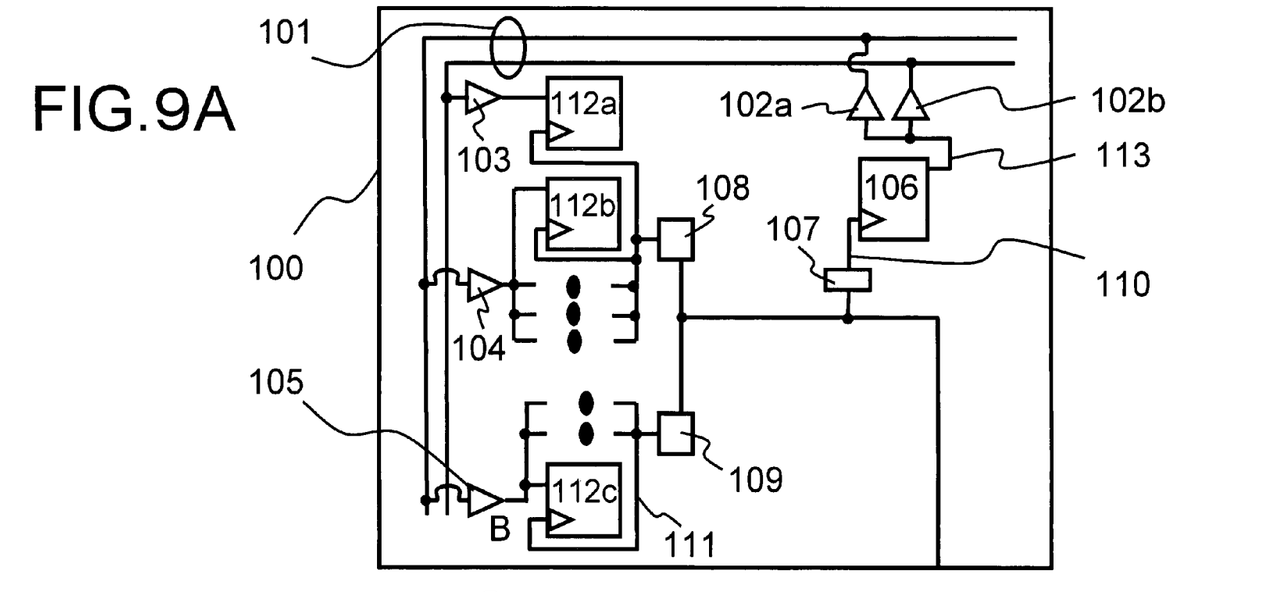
FIG. 9A shows a semiconductor device configured to analyzing timing at the step of performing the timing analysis, the consumption-power evaluation, and the area estimation.
Figure 9B:
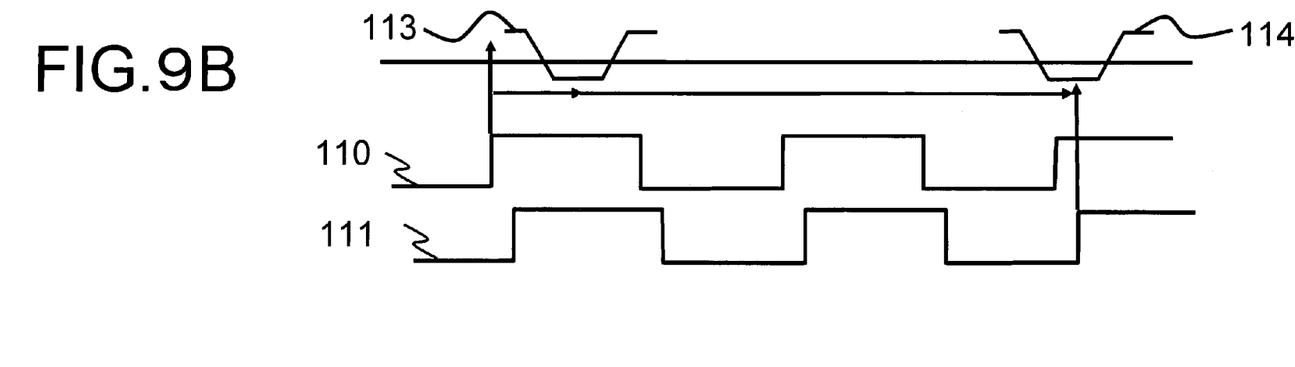
FIG. 9B shows example timing analysis performed at the step of performing the timing analysis, the consumption-power evaluation, and the area estimation.

FIGS. 9A and 9B illustrate how the timing analysis is performed at step 7 where the timing analysis, the consumption-power evaluation, and the area estimation are performed. FIGS. 9A and 9B show a semiconductor device 100, a bus 101, buffers 102a, 102b, 103, 104, and 105 that form a buffer tree, storage 106, clock buffers 107, 108, and 109, a clock signal A 110, a clock signal B 111, storage elements 112, an output signal A 113 output from the storage 106, and an output signal B 114 that reaches the storage elements 112c.

FIG. 9A shows the semiconductor device 100 performing the timing analysis. The semiconductor device 100 has the storage 106 and the storage elements 112a, 112b, 112c, and the above-described buffer tree including the buffers 102a, 102b, 103, 104, and 105, and the bus 101. The storage 106 outputs the output signal A 113 by the clock signal A 110 transmitted from the clock buffer 107. The storage elements 112c receive the output signal B 114 by the clock signal B 111 transmitted from the clock buffers 108 and 109. Further, the storage 106 has a register in its output end, and each of the storage elements 112a, 112b, 112c has a register in its input end. Therefore, the registers of the storage 106 and the storage-elements 112a, 112b, 112c, and the above-described buffer tree have the same configurations as those of the registers 81, 84, 85, 86, 87, 88, 89, 90, and 91, and the buffer tree 98 that are shown in FIG. 8.

FIG. 9B shows example timing analysis. The clock signal A 110 and the clock signal B 111 are synchronized with each other. The output signal A 113 output from the storage 106 reaches the input end of the storage elements 112c with a lag of two clock periods, as the output signal B 114. Then, the storage elements 112c receive the output signal B 114 by the clock signal B.

The timing analysis is performed in the following manner. First, the delay time of the output signal A 113 is calculated according to the characteristic description of the register of the storage 106, where the delay time denotes a time period until the output signal A 113 is output from the storage 106 by the clock signal A 110. Next, the delay time of the output signal B 114 is calculated according to the characteristic description of the buffer tree, where the delay time of the output signal B 114 denotes a time period until the output signal A 113 reaches the storage elements 112, as the output signal B 114. Then, the sum of the delay time of the output signal A 113 and that of the output signal B 114 is calculated. Further, the time difference between the clock signal A 110 and the clock signal B 111 is calculated, and a permissible transmission time including the time period corresponding to two periods of the clock signal B 111 and the time difference between the clock signals is calculated. Then, it is determined whether or not the sum of the delay times falls within the permissible transmission time. Thus, the timing analysis denotes determining whether or not the delay time of a signal transmitted from the output end of one register to the input end of another register falls within the permissible transmission time.

Then, the consumption-power evaluation is performed in the following manner. First, the consumption power of each of the register of the storage 106, the buffer tree, and the registers of the storage elements 112 is calculated according to the characteristic description of each of the register of the storage 106, the buffer tree, and the registers of the storage elements 112. Then, the sum of the consumption power of the register of the storage 106, the consumption power of the buffer tree, and the consumption power of the registers of the storage elements 112 is calculated. Namely, the consumption-power evaluation denotes obtaining the consumption power of each of the elements of the semiconductor device 100 according to the characteristic descriptions of the elements and calculating the sum of the obtained consumption power.

Next, the area estimation is achieved by calculating the areas of the buffers on the basis of the characteristic description of the buffer tree and further calculating the sum of the buffer areas and the areas of the semiconductor device 106, the storage elements 112, and so forth that are provided on the semiconductor device 100. Namely, the area estimation denotes calculating the sum of areas calculated based on the buffer-tree-characteristic description or the like.

Thus, the above-described logic-synthesis method includes the steps of generating a library including the buffer-tree-characteristic description, determining the position where the fanout value becomes greater than the predetermined value, determining the configuration of the buffer tree corresponding to the above-described position, and performing logic synthesis by using the above-described library. Therefore, it becomes possible to calculate the delay time at the position where the fanout value is greater than the predetermined value by using the buffer-tree-characteristic description prepared in advance in consideration of an actual physical layout. Further, it becomes possible to analyze the timing of a signal and estimate consumption power or the like with precision during logic synthesis is performed.

Subsequently, timing violation can be corrected on the basis of the timing analysis when the logic synthesis is performed. Therefore, it becomes possible to reduce significant timing violation that occurs when the layout processing is performed. Further, consumption power can be reduced on the basis of the consumption-power estimation, for example. Subsequently, it becomes possible to reduce an unpredictable increase in the consumption power and the timing deterioration caused by improved consumption power or the like when the layout processing is performed.

[Second Embodiment]

Figure 10:
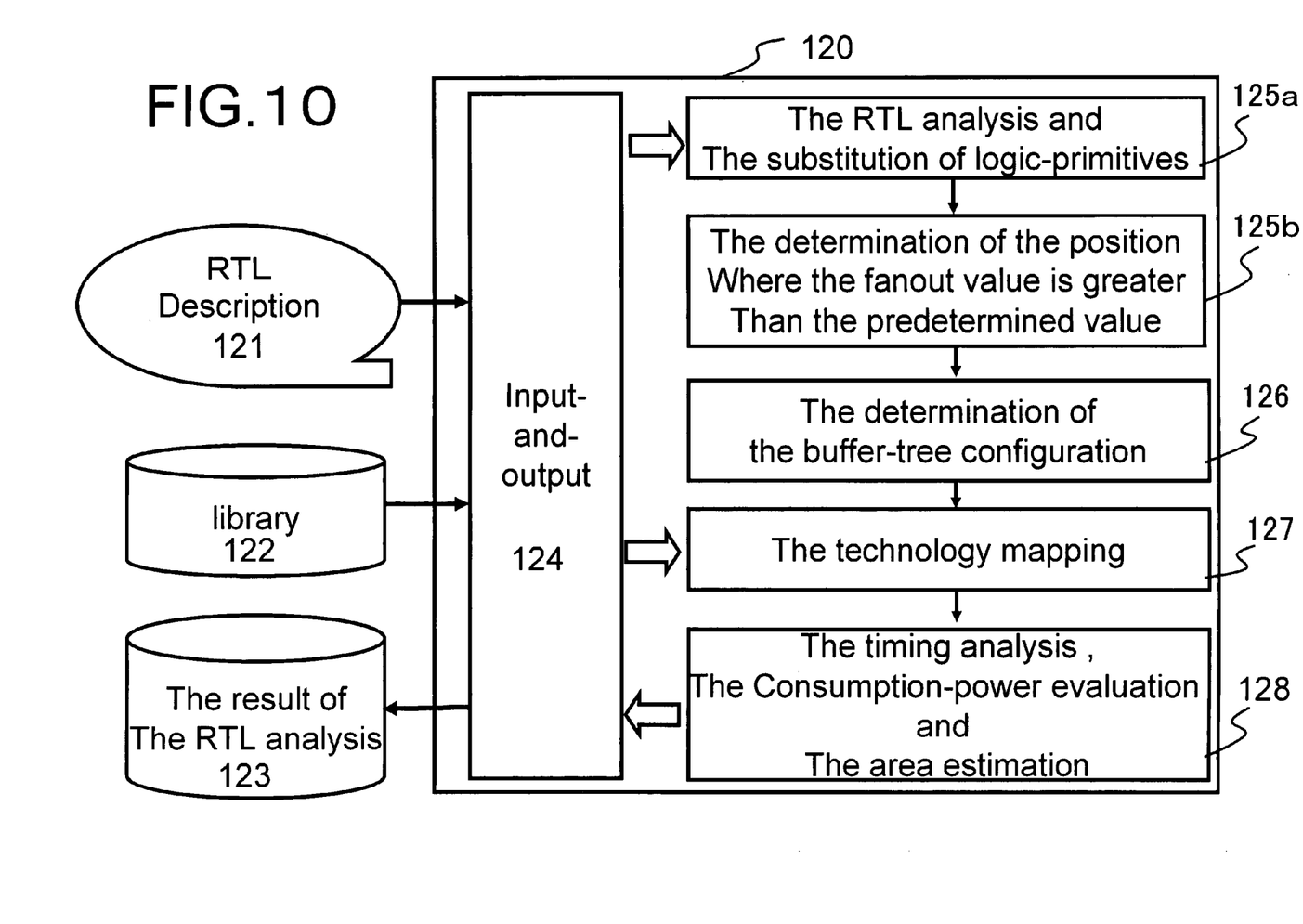
FIG. 10 shows a logic synthesizer according to a second embodiment of the present invention.

FIG. 10 illustrates a logic synthesizer according to a second embodiment of the present invention. The logic synthesizer performs the logic-synthesis method of the first embodiment.

FIG. 10 shows a logic synthesizer 120, an RTL description 121, a library 122, logic-synthesis-result information 123, an input-and-output unit 124, a unit 125a configured to perform RTL analysis and substitution of logic primitives, a unit 125b configured to determine the position where the fanout value becomes greater than a predetermined value, a unit 126 configured to specify the buffer-tree configuration, a technology-mapping unit 127, and a unit 128 configured to perform the timing analysis, the consumption-power evaluation, and the area estimation.

The RTL description 121 is the same as the RTL description shown in FIG. 2. The library 122 is the same as the library 60 shown in FIG. 5. The logic-synthesis-result information 123 is a file obtained after logic synthesis is performed by the logic synthesizer 120.

The logic synthesizer 120 includes the input-and-output unit 124, the unit 125a configured to perform the RTL analysis and the substitution of logic primitives, the unit 125b configured to determine the position where the fanout value becomes greater than the predetermined value, the unit 126 configured to specify the buffer-tree configuration, the technology-mapping unit 127, and the unit 128 configured to perform the timing analysis, the consumption-power evaluation, and the area estimation. Then, the input-and-output unit 124 receives the RTL description 121 and the library 122, and outputs the logic-synthesis-result information 123. The unit 125a is configured to perform the step of performing the RTL analysis and the substitution of logic primitives that are shown in FIG. 2. The determination unit 125b is configured to perform the step of determining the position where the fanout value shown in FIG. 3 becomes greater than the predetermined value. The buffer-tree-configuration specification unit 126 is configured to specify the configuration of the buffer tree shown in FIG. 4. The technology-mapping unit 127 is configured to perform the technology mapping shown in FIG. 8. Further, the unit 128 is configured to perform the timing analysis, the consumption-power evaluation, and the area estimation that are described in FIG. 9.

Thus, the logic synthesizer of the second embodiment includes the unit configured to generate the library including the buffer-tree characteristic description, the unit configured to determine the position where the fanout value is greater than the predetermined value, the unit configured to specify the buffer-tree configuration corresponding to the above-described position, and the unit configured to perform logic synthesis by using the library. Subsequently, the logic synthesizer can calculate the delay time of the position where the fanout value is greater than the predetermined value, based on the buffer-tree characteristic description prepared in advance in consideration of an actual physical layout. Further, it becomes possible to analyze the timing of a signal and estimate consumption power or the like with precision during logic synthesis is performed.

Subsequently, timing violation can be corrected on the basis of the timing analysis when the logic synthesis is performed. Therefore, it becomes possible to reduce significant timing violation that occurs when the layout processing is performed. Further, consumption power can be reduced on the basis of the estimation of consumption power or the like. Subsequently, it becomes possible to reduce an unpredictable increase in the consumption power and the timing deterioration caused by improved consumption power or the like when the layout processing is performed.

Hereinafter, the characteristics of the present invention will be described.

I claim:

1. A method for performing logic synthesis for a logic circuit, comprising the steps of:
   generating a library including a description of characteristics of a buffer tree, the description of the characteristics of the buffer tree being obtained in advance by performing circuit simulation in consideration of physical layout performed based on track records;
   generating logic primitives for the logic circuit from a specification description of the logic circuit;
   determining a position in the logic primitives where a drive element drives a number of driven elements, the number being greater than predetermined number;
   determining a configuration of the buffer tree corresponding to the position;
   mapping the logic circuit by substituting the logic primitives for the description of the characteristics of the buffer tree; and
   performing the logic synthesis by using the description of characteristic of the buffer tree in the library.

2. The method for performing logic synthesis as claimed in claim 1,
   wherein the description of characteristics of the buffer tree includes an information about a delay amount of a signal transmitted from an input end of the buffer tree.

3. The method for performing logic synthesis as claimed in claim 1,
   wherein the description of characteristics of the buffer tree includes an information about an area occupied by pattern layout.

4. The method for performing logic synthesis as claimed in claim 1,
   wherein the description of characteristics of the buffer tree includes an information about consumption power of the buffer tree.

5. The method for performing logic synthesis as claimed in claim 1, further comprising the step of:
   performing a timing analysis of a signal in a semiconductor device.

6. The method for performing logic synthesis as claimed in claim 1, further comprising the step of:
   estimating a consumption power of a circuit in a semiconductor device.

7. The method for performing logic synthesis as claimed in claim 1, further comprising the step of:
   achieving a area estimation of a circuit in a semiconductor device.

8. An apparatus for performing logic synthesis for a logic circuit, comprising the steps of:
   a generator for generating a library including a description of characteristics of a buffer tree, the description of the characteristics of the buffer tree being obtained in advance by performing circuit simulation in consideration of physical layout performed based on track records;
   a generator for generating logic primitives for the logic circuit from a specification description of the logic circuit;
   a first determiner for determining a position in the logic primitives where a drive element drives a number of driven elements, the number being greater than predetermined number;
   a second determiner for determining a configuration of the buffer tree corresponding to the position;

a mapping means for mapping the logic circuit by substituting the logic primitives for the description of the characteristics of the buffer tree; and a performer for performing the logic synthesis by using the description of characteristic of the buffer tree in the library.

9. The apparatus for performing logic synthesis as claimed in claim 8, wherein the description of characteristics of the buffer tree includes an information about a delay amount of a signal transmitted from an input end of the buffer tree.

10. The apparatus for performing logic synthesis as claimed in claim 8, wherein the description of characteristics of the buffer tree includes an information about an area occupied by pattern layout.

11. The apparatus for performing logic synthesis as claimed in claim 8, wherein the description of characteristics of the buffer tree includes an information about consumption power of the buffer tree.

12. The apparatus for performing logic synthesis as claimed in claim 8, further comprising:

a first unit for performing a timing analysis of a signal in a semiconductor device.

13. The apparatus for performing logic synthesis as claimed in claim 8, further comprising:

a second unit for estimating a consumption power of a circuit in a semiconductor device.

14. The apparatus for performing logic synthesis as claimed in claim 8, further comprising:

a third unit for achieving a area estimation of a circuit in a semiconductor device.

15. A method for performing logic synthesis for a logic circuit, comprising:

performing circuit simulation of the logic circuit;

obtaining a description of characteristics of a buffer tree in advance from the circuit simulation;

generating a library including a description of the characteristics of the buffer tree;

generating logic primitives for the logic circuit from a specification description of the logic circuit;

determining a position in the logic primitives where a drive element drives a number of driven elements, the number being greater than predetermined number;

determining a configuration of the buffer tree corresponding to the position;

substituting the logic primitives for the description of the characteristics of the buffer tree corresponding to the position; and performing the logic synthesis by using the description of characteristics of the buffer tree in the library.

* * * * *